US010593524B2

(12) United States Patent
Narita (10) Patent No.: US 10,593,524 B2
(45) Date of Patent: Mar. 17, 2020

(54) NIOBIUM OXIDE SINTERED COMPACT, SPUTTERING TARGET FORMED FROM SAID SINTERED COMPACT, AND METHOD OF PRODUCING NIOBIUM OXIDE SINTERED COMPACT

(71) Applicant: JX Nippon Mining & Metals Corporation, Tokyo (JP)

(72) Inventor: Satoyasu Narita, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 162 days.

(21) Appl. No.: 15/516,954

(22) PCT Filed: Sep. 14, 2015

(86) PCT No.: PCT/JP2015/075952
§ 371 (c)(1),
(2) Date: Apr. 5, 2017

(87) PCT Pub. No.: WO2016/056352
PCT Pub. Date: Apr. 14, 2016

(65) Prior Publication Data
US 2017/0309460 A1   Oct. 26, 2017

(30) Foreign Application Priority Data

Oct. 6, 2014   (JP) ................. 2014-205389

(51) Int. Cl.
*H01J 37/34*   (2006.01)
*C23C 14/34*   (2006.01)
(Continued)

(52) U.S. Cl.
CPC ........ *H01J 37/3426* (2013.01); *C04B 35/495* (2013.01); *C04B 35/6261* (2013.01);
(Continued)

(58) Field of Classification Search
CPC ............... H01J 37/3426; H01J 37/3429; H01J 37/3435; H01J 37/3491; C23C 14/3414;
(Continued)

(56) References Cited

U.S. PATENT DOCUMENTS 6,193,856 B1   2/2001   Kida et al.
8,430,978 B2   4/2013   Inoue et al.
(Continued)

FOREIGN PATENT DOCUMENTS

CN   101864555 A   10/2010
JP   H08-283935 A   10/1996
(Continued)

OTHER PUBLICATIONS

Machine Translation KR 2011052119 (Year: 2011).*

*Primary Examiner* — Michael A Band
(74) *Attorney, Agent, or Firm* — Howson & Howson LLP (57) ABSTRACT

The present invention provides a niobium oxide sintered compact having a composition of $NbO_x$ ($2<x<2.5$), and specifically provides a niobium oxide sintered compact which can be applied to a sputtering target for forming a high-quality resistance change layer for use in ReRAM. In particular, the present invention aims to provide a high-density niobium oxide sintered compact suitable for stabilizing the sputtering process.

14 Claims, 7 Drawing Sheets

(51) Int. Cl.
  *C23C 14/08* (2006.01)
  *C04B 35/495* (2006.01)
  *C04B 35/626* (2006.01)
  *C04B 35/645* (2006.01)
(52) U.S. Cl.
  CPC .......... *C04B 35/645* (2013.01); *C23C 14/083* (2013.01); *C23C 14/3414* (2013.01); *C04B 2235/3251* (2013.01); *C04B 2235/3253* (2013.01); *C04B 2235/3255* (2013.01); *C04B 2235/5436* (2013.01); *C04B 2235/656* (2013.01); *C04B 2235/72* (2013.01); *C04B 2235/77* (2013.01); *C04B 2235/786* (2013.01); *C04B 2235/95* (2013.01); *C04B 2235/96* (2013.01)
(58) Field of Classification Search
  CPC ... C23C 14/083; C04B 35/495; C04B 35/645; C04B 37/026; C04B 35/6261
  See application file for complete search history.

(56) References Cited

U.S. PATENT DOCUMENTS

| 8,974,648 | B2 | 3/2015 | Otani et al. |
| 2005/0205998 | A1 | 9/2005 | Yamada et al. |
| 2007/0045694 | A1 | 3/2007 | Hsu |
| 2013/0126800 | A1 | 5/2013 | Backhaus-Ricoult |
| 2015/0255260 | A1 | 9/2015 | Narita |

FOREIGN PATENT DOCUMENTS

| JP | 2002-338354 A | | 11/2002 |
| JP | 2011-071380 A | | 4/2011 |
| KR | 2011052119 A | * | 5/2011 |
| WO | 2014/132872 A1 | | 9/2014 |

* cited by examiner

|  | x intended at time of mixing | x obtained from TG-DTA |
|---|---|---|
| Example 1 | 2.25 | 2.25 |
| Example 2 | 2.30 | 2.30 |
| Example 3 | 2.20 | 2.20 |
| Comparative Example 1 | 2.25 | 2.28 |
| Comparative Example 2 | 2.25 | 2.27 |
|  |  | 2.25 |

| Composition | x obtained from TG-DTA |
|---|---|
| $Nb_2O_5$ | 2.50 |
| $NbO_2$ | 2.00 |

NIOBIUM OXIDE SINTERED COMPACT, SPUTTERING TARGET FORMED FROM SAID SINTERED COMPACT, AND METHOD OF PRODUCING NIOBIUM OXIDE SINTERED COMPACT

BACKGROUND

The present invention relates to a niobium oxide sintered compact, a sputtering target formed from the sintered compact, and a method of producing the niobium oxide sintered compact.

In recent years, ReRAM which utilizes the significant change of electrical resistance caused by voltage application draws attention as an alternative to a flash memory, and known is the use of oxides of transition metals such as nickel, titanium, tantalum and niobium, as the resistance change layer of the ReRAM; particularly oxides (suboxides) having a composition which deviates from stoichiometry (refer to Patent Documents 1 to 3). For example, Patent Document 1 discloses a niobium pentoxide ($Nb_2O_5$) as the resistance change layer provided in the ReRAM.

A thin film formed from a niobium oxide is normally formed via the sputtering method. For example, Patent Document 4 relates to an example of a niobium pentoxide and discloses a niobium oxide sputtering target which is produced by subjecting a niobium pentoxide powder to pressure sintering by way of hot press or other means.

Meanwhile, when producing a sintered compact for use as a target, the simplest production method is to match the composition of the intended sintered compact and the composition of the raw material. Nevertheless, niobium oxides that are generally available as a single phase are the three types of NbO, $NbO_2$, and $Nb_2O_5$. For example, a suboxide such as $NbO_{2.2}$ is not available as a raw material, and therefore it was not previously possible to produce a sintered compact having a composition of $NbO_x$ ($2<x<2.5$). Note that, among $NbO_x$ ($2<x<2.5$), $Nb_{12}O_{29}$ ($\approx NbO_{2.417}$) is available, but it is difficult to acquire because it is not distributed on the market.

Thus, considered may be a method of producing a sintered compact having a composition that differs from the composition of the raw material based on reaction sintering (method of simultaneously performing synthesis and sintering). However, when a metal (Nb) and its oxide are mixed and sintered to obtain the intended composition (valence of oxygen) and prepare a sintered compact, there are problems in that an unreacted substance may remain or numerous small holes are formed in the sintered compact. In addition, when producing a large sintered compact, there is a problem in that the in-plane density of the sintered compact is not uniform.

CITATION LIST

Patent Documents

Patent Document 1: JP 2011-149091 A
Patent Document 2: JP 2011-071380 A
Patent Document 3: JP 2007-067402 A
Patent Document 4: JP 2002-338354 A

SUMMARY

The present invention provides a sintered compact having a composition of $NbO_x$ ($2<x<2.5$) that can be used as a sputtering target, and a method of producing such sintered compact.

In order to resolve the foregoing problems, as a result of intense study, the present inventor discovered that a sintered compact having a composition of $NbO_x$ ($2<x<2.5$) which can be used as a sputtering target, particularly a sintered compact having a high density and which is effective for use as a large sputtering target, can be obtained by adjusting and mixing $NbO_2$ and $Nb_2O_5$ so that the calculated valence of oxygen will be $NbO_x$ ($2<x<2.5$), and then sintering the mixed powder.

Based on the foregoing discovery, the present invention provides:

1) A niobium oxide sintered compact having a composition of $NbO_x$ ($2<x<2.5$);
2) The niobium oxide sintered compact according to 1) above, wherein a ratio of an X-ray diffraction peak intensity from a (110) plane of Nb relative to the maximum X-ray diffraction peak intensity, among X-ray diffraction peaks of a (400) plane of $NbO_2$, and a (001) plane and a (110) plane of $Nb_2O_5$, or any X-ray diffraction peaks within a range of $2\theta=20$ to $60°$, is 1% or less;
3) The niobium oxide sintered compact according to 1) or 2) above, wherein the niobium oxide sintered compact has a relative density of 90% or higher;
4) The niobium oxide sintered compact according to any one of 1) to 3) above, wherein a difference in density at arbitrary in-plane points of the sintered compact is 1.0% or less;
5) The niobium oxide sintered compact according to any one of 1) to 4) above, wherein the niobium oxide sintered compact has a diameter of 58 mm or more;
6) The niobium oxide sintered compact according to any one of 1) to 5) above, wherein the niobium oxide sintered compact has a resistivity of 10 Ω·cm or less;
7) The niobium oxide sintered compact according to 6) above, wherein the niobium oxide sintered compact contains a phase of $Nb_{12}O_{29}$;
8) The niobium oxide sintered compact according to 7) above, wherein a ratio of an X-ray diffraction peak intensity from a $Nb_{12}O_{29}$ (400) plane relative to an X-ray diffraction peak intensity from a $NbO_2$ (400) plane is 10% or higher;
9) A sputtering target produced from the niobium oxide sintered compact according to any one of 1) to 8) above;
10) A method of producing a niobium oxide sintered compact, wherein a $NbO_2$ powder and a $Nb_2O_5$ powder are mixed, and sintered via hot press at 950° C. to 1300° C.;
11) The method of producing a niobium oxide sintered compact according to 10) above, wherein an average grain size of the $NbO_2$ powder is 1 to 10 μm, and an average grain size of the $Nb_2O_5$ powder is 1 to 10 μm;
12) The method of producing a niobium oxide sintered compact according to 10) or 11) above, wherein the $NbO_2$ powder and the $Nb_2O_5$ powder are mixed via wet blending; and
13) The method of producing a niobium oxide sintered compact according to any one of 10) to 12) above, wherein the $NbO_2$ powder has a purity of 99.9% or higher, and the $Nb_2O_5$ powder has a purity of 99.9% or higher.

According to the present invention, it is possible to obtain a sintered compact having a composition in which the calculated valence of oxygen is $NbO_x$ ($2<x<2.5$) by mixing and sintering $NbO_2$ and $Nb_2O_5$. In particular, the sintered compact of the present invention has a high density, and therefore, the sputtering target obtained by machining such sintered compact yields superior effects of enabling stable sputtering without any generation of abnormal discharge during sputtering, and formation of a high-quality $NbO_x$ ($2<x<2.5$) thin film with minimal generation of particles. Moreover, the present invention also yields a superior effect of being able to provide a high density sputtering target in response to recent demands of a large sputtering target.

DETAILED DESCRIPTION

The niobium oxide sintered compact of the present invention is characterized by having a composition in which the calculated valence of oxygen is $NbO_x$ (2<x<2.5). As described above, when a sintered compact of a niobium suboxide is produced from Nb and its oxide based on the generally performed reaction sintering (method of simultaneously performing synthesis and sintering), complete synthesis cannot be realized even when the sintering temperature and other conditions are adjusted, and niobium metal indicated in the subsequent Comparative Examples may remain as an unreacted substance. Voids, which may cause the generation of particles, are sometimes formed around the unreacted substance. Moreover, because the niobium metal and the reacted niobium oxide have different conductivity, microarcing may be generated at the corresponding portions.

In light of the foregoing circumstances, there is also a method of mixing Nb and $Nb_2O_5$ in advance to attain the intended oxygen valence and performing synthesis in advance, and thereafter producing a sintered compact, in order to prevent the generation of an unreacted substance while using Nb and its oxide. Nevertheless, when the composition deviates from the intended composition, it is necessary to add Nb or $Nb_2O_5$, but particularly in the case of adding Nb, re-synthesis is required for preventing the generation of an unreacted substance, and there is a problem in that the process becomes complicated. Consequently, it was extremely difficult to produce a sintered compact of a niobium suboxide from Nb and its oxide.

Nevertheless, according to the present invention, since pre-synthesized $NbO_2$ and $Nb_2O_5$ are mixed and sintered, it is possible to produce a sintered compact having a composition in which the calculated valence of oxygen is $NbO_x$ (2<x<2.5) without any unreacted substance. In addition, even when the composition deviates from the intended composition at the time of mixing, there is no need to perform re-synthesis since it will be sufficient to add synthesized $NbO_2$ or $Nb_2O_5$. Furthermore, this kind of sintered sputtering target is able to stably deposit a $NbO_x$ (2<x<2.5) thin film.

The valence of oxygen of the niobium oxide sintered compact can be obtained as follows.

Foremost, the weight change of the sintered compact is measured with the TG-DTA device manufactured by Rigaku. When the sintered compact is heated, the weight will gradually increase. This is because $NbO_x$ (2<x<2.5) is heated in the atmosphere to become a stable $Nb_2O_5$, and the weight will increase due to oxygen adsorption. Subsequently, the weight change becomes saturated near a predetermined temperature, and the weight change at the time of saturation is represented as $\Delta M$ %. As described above, since the weight change corresponds to the change of oxygen, it is represented with the following formula.

(molecular weight of $NbO_{2.5}$)÷(molecular weight of $NbO_x$)=1+$\Delta M$/100=(Nb+O×2.5)/(Nb+O×x)

When this is solved to obtain x (valence of oxygen), x=(O×2.5−$\Delta M$×Nb/100)/(1+$\Delta M$/100)/O (atomic weight of O: 15.9994 g/mol, atomic weight of Nb: 92.9 g/mol)

When the measured $\Delta M$ is applied to the foregoing formula, the calculated valence (x) of oxygen is obtained.

Moreover, with the niobium oxide sintered compact of the present invention, preferably, a ratio of an X-ray diffraction peak intensity from a (110) plane of Nb relative to the maximum X-ray diffraction peak intensity, among X-ray diffraction peaks of a (400) plane of $NbO_2$, and a (001) plane and a (110) plane of $Nb_2O_5$, or any X-ray diffraction peaks within a range of 2θ=20 to 60°, is 1% or less. This kind of sintered target which is substantially free from Nb metal enables stable sputtering. Note that, since the peak intensity of $NbO_2$ and the peak intensity of $Nb_2O_5$ increase/decrease depending on the composition, it is necessary to compare the maximum peak intensity among the foregoing peak intensities or the maximum peak intensity at the time of scanning up to 2θ=20 to 60°, with the peak intensity of the Nb metal.

Since the niobium oxide sintered compact of the present invention has a high density; specifically, a relative density of 90% or higher and preferably 95% or higher, the sputtering target obtained by machining such sintered compact enables stable sputtering without any generation of abnormal discharge during sputtering, and is able to form high-quality thin films with minimal generation of particles.

Moreover, the present invention can suppress the difference in density at arbitrary in-plane points of the sintered compact to be 1.0% or less, and preferably 0.5% or less. By suppressing the variation in the in-plane density of the sintered compact, the uniformity of the film deposited via sputtering can be improved.

The foregoing difference in density can be obtained as {(relative density of point having high relative density)/(relative density of point having low relative density)−1}×

100(%) based on a total of five points at the center and of ½ points in the radial direction (4 points for every 90°) in the plane of the sintered compact. Note that the size of the respective points for measuring the density shall be 12±2 mm square (thickness direction shall be the thickness of the sintered compact).

The present invention yields superior effects in a $NbO_x$ (2<x<2.5) sintered compact having a diameter of 58 mm or more, as well as in a large $NbO_x$ (2<x<2.5) sintered compact having a diameter of 110 mm or more, and even a diameter of 460 mm or more. As described above, when producing a large sintered compact, the shape of the sintered compact may deform unlike the cases of producing a small sintered compact. The hot press conditions set for small samples may be applied without change to sintered compacts having a diameter of less than 110 mm. However, when the sintered compact has a diameter of 110 mm or more, it is difficult to produce a high-density sintered compact if the hot press conditions for small samples are applied without change because the shape of the sintered compact may deform. Note that, while there is no upper limit in the size of the sintered compact, the maximum size of the sintered compact is preferably around a diameter of 480 mm from the perspective of production.

Moreover, when the niobium oxide sintered compact of the present invention is to be used as a target, there are demands for use in DC sputtering which enables high-speed deposition, and, in such a case, the resistivity needs to be low. While this will vary depending on the sputtering equipment and conditions, resistivity which enables DC sputtering is 100 Ω·cm or less, and preferably 10 Ω·cm or less.

The niobium oxide sintered compact of the present invention having a composition of NbOx (2<x<2.5) possesses an extremely unique property of exhibiting low resistivity in comparison to sintered compacts in other compositional range (for instance, x=2, x=2.5) as described in the ensuing Examples. While the reason for this is not necessarily clear, it is considered from the X-ray diffraction profile of the sintered compact of the present invention that this is because of the existence of the $Nb_{12}O_{29}$ phase. Thus, with the present invention, an intensity ratio of an X-ray diffraction peak intensity from a $Nb_{12}O_{29}$ (400) plane relative to an X-ray diffraction peak intensity from a $NbO_2$ (400) plane is 10% or higher.

The niobium oxide sintered compact of the present invention having a composition of NbOx (2<x<2.5) can be produced, for example, as follows.

Foremost, a $NbO_2$ powder having an average grain size of 2.0 μm and a $Nb_2O_5$ powder having an average grain size of 2.0 μm are prepared. Note that, when the grain size of the commercially available raw material powder is coarse, it is effective to pulverize the raw material powder with an SC mill or the like. Subsequently, the $NbO_2$ powder and the $Nb_2O_5$ powder are weighed to attain the intended ratio, and then mixed. Here, wet blending is preferably performed to uniformly mix the powders. For example, the mixed powder may be placed in ethanol or deionized water to obtain a slurry, and the slurry may be mixed to achieve uniform mixing. The slurry is thereafter dried and crushed.

Next, the mixed $NbO_x$ (2<x<2.5) powder is sintered via hot press. The hot press temperature is set to be 950° C. to 1300° C. Generally speaking, the relative density will increase as the temperature is higher. However, in the case of a NbOx (2<x<2.5) powder, when the sintering temperature exceeds 1300° C., the sintered compact may swell and crack due to the out gas generated during the sintering process. Thus, the upper limit of the sintering temperature is set to 1300° C. Meanwhile, the lower limit of the sintering temperature is set to 950° C. This is because, according to TMA (thermomechanical analysis), one-dimensional contraction cannot be obtained when the sintering temperature is 950° C. or less.

Moreover, in the case of a large sintered compact, in particular a sintered compact having a diameter of 110 mm or more, the hot press sintering temperature is preferably set to 950° C. to 1100° C. When the sintering temperature exceeds 1100° C., the density of the sintered compact will deteriorate due to the out gas generated during the sintering process, differences will arise in the density between the arbitrary points at the ends (within 30 mm from the edge) and the center point in the plane of the sintered compact, and the sintered compact itself may also become cracked.

A high-density $NbO_x$ (2<x<2.5) sintered compact can be obtained based on the foregoing process. The obtained sintered compact can be subsequently machined via cutting and polishing to prepare a sputtering target. In addition, the obtained sputtering target may be used to form a thin film having a composition of $NbO_x$ (2<x<2.5).

EXAMPLES

The present invention is now explained based on the following Examples and Comparative Examples. Note that these Examples are merely exemplifications, and the present invention is not in any way limited by these Examples. In other words, the present invention is limited only by the scope of claims, and various modifications other than the following Examples included in the present invention are also covered by this invention.

Example 1

A $NbO_2$ powder having an average grain size of 1.4 μm and a purity of 99.9%, and a $Nb_2O_5$ powder having an average grain size of 20 μm and a purity of 99.9% were prepared. Because the grain size of the $Nb_2O_5$ powder was coarse at 20 μm, the $Nb_2O_5$ powder was pulverized with an SC mill until the grain size became comparable with the grain size of the $NbO_2$ powder ($D_{50}$=roughly 1.4 μm).

Subsequently, the $Nb_2O_5$ powder and the $NbO_2$ powder were weighed to attain $NbO_{2.25}$ ($Nb_2O_5$ powder and $NbO_2$ powder in a weight ratio of 51.55% to 48.45%), and then mixed. Mixing was performed via wet blending, and the raw material powders were placed in ethanol to obtain a slurry, and the slurry was mixed and thereafter dried and crushed to obtain a mixed powder.

Subsequently, the obtained $NbO_{2.25}$ powder was subject to hot press sintering. The hot press sintering was performed with the intended shape being a diameter of 58 mm and a thickness of 10 mm, and at a hot press temperature of 1300° C. Consequently, the obtained sintered compact has an average relative density of 97.6%, and was high density. Moreover, it was possible to suppress the difference in the in-plane density distribution of the sintered compact to 0.5% or less. Note that the relative density was calculated with the true density (theoretical density) as 5.112 g/cm³.

Next, the sintered compact was evaluated using the X-ray diffraction device manufactured by Rigaku, and the peak intensity of $NbO_2$ (400) that appears near 2θ=25.99° was 3220 cps, the peak intensity of $Nb_2O_5$ (001) that appears near 2θ=22.61° was 40 cps, the peak intensity of (110) that appears near 2θ=23.74° was 1023 cps, and the peak intensity of Nb (110) that appears near 2θ=38.56° was 17 cps. Since the peak intensity of NbO$_2$ and the peak intensity of Nb$_2$O$_5$ increase/decrease depending on the composition, a comparison was made between the maximum peak intensity among the foregoing peak intensities or the maximum peak intensity at the time of scanning up to 2θ=20 to 60°, and the peak intensity of the Nb (110). Consequently, the maximum intensity was NbO$_2$ (400), and the comparative result was 1% or less as represented by Nb (110)÷NbO$_2$ (400)=0.53%.

Example 2

A NbO$_2$ powder having an average grain size of 1.4 μm and a purity of 99.9%, and a Nb$_2$O$_5$ powder having an average grain size of 20 μm and a purity of 99.9% were prepared. Because the grain size of the Nb$_2$O$_5$ powder was coarse at 20 μm, the Nb$_2$O$_5$ powder was pulverized with an SC mill until the grain size became comparable with the grain size of the NbO$_2$ powder (D$_{50}$=roughly 1.4 μm).

Subsequently, the Nb$_2$O$_5$ powder and the NbO$_2$ powder were weighed to attain NbO$_{2.30}$ (Nb$_2$O$_5$ powder and NbO$_2$ powder in a weight ratio of 61.48% to 38.52%), and then mixed. Mixing was performed via wet blending, and the raw material powders were placed in ethanol to obtain a slurry, and the slurry was mixed and thereafter dried and crushed to obtain a mixed powder.

Subsequently, the obtained NbO$_{2.30}$ powder was subject to hot press sintering. The hot press sintering was performed with the intended shape being a diameter of 480 mm and a thickness of 10 mm, and at a hot press temperature of 1100° C. Consequently, the obtained sintered compact has an average relative density of 96.7%, and was high density. Moreover, it was possible to suppress the difference in the in-plane density distribution of the sintered compact to 0.5% or less. Note that the relative density was calculated with the true density (theoretical density) as 4.984 g/cm$^3$.

Next, the sintered compact was evaluated using the X-ray diffraction device manufactured by Rigaku, and the peak intensity of NbO$_2$ (400) was 1583 cps, the peak intensity of Nb$_2$O$_5$ (001) was 104 cps, the peak intensity of (110) was 480 cps, and the peak intensity of Nb (110) was 14 cps. Since the peak intensity of NbO$_2$ and the peak intensity of Nb$_2$O$_5$ increase/decrease depending on the composition, a comparison was made between the maximum peak intensity among the foregoing peak intensities or the maximum peak intensity at the time of scanning up to 2θ=20 to 60°, and the peak intensity of the Nb (110). Consequently, the maximum intensity was NbO$_2$ (400), and the comparative result was 1% or less as represented by Nb (110)÷NbO$_2$ (400)=0.88%.

Example 3

A NbO$_2$ powder having an average grain size of D$_{50}$=1.4 μm and a purity of 99.9% was weighed and added to the mixed powder targeting NbO$_{2.30}$ prepared in Example 2 to attain NbO$_{2.20}$, and then mixed. Mixing was performed via wet blending, and the raw material powders were placed in ethanol to obtain a slurry, and the slurry was mixed and thereafter dried and crushed to obtain a mixed powder.

Subsequently, the obtained NbO$_{2.20}$ powder was subject to hot press sintering. The hot press sintering was performed with the intended shape being a diameter of 170 mm and a thickness of 10 mm, and at a hot press temperature of 950° C. Consequently, the obtained sintered compact has an average relative density of 96.3%, and was high density. Moreover, it was possible to suppress the difference in the in-plane density distribution of the sintered compact to 0.5% or less. It can be understood that there is no problem in adding a different raw material to a once-mixed raw material as described above. Note that the relative density was calculated with the true density (theoretical density) as 5.249 g/cm$^3$.

Next, the sintered compact was evaluated using the X-ray diffraction device manufactured by Rigaku, and the peak intensity of NbO$_2$ (400) was 2963 cps, the peak intensity of Nb$_2$O$_5$ (001) was 32 cps, the peak intensity of (110) was 901 cps, and the peak intensity of Nb (110) was 13 cps. Since the peak intensity of NbO$_2$ and the peak intensity of Nb$_2$O$_5$ increase/decrease depending on the composition, a comparison was made between the maximum peak intensity among the foregoing peak intensities or the maximum peak intensity at the time of scanning up to 2θ=20 to 60°, and the peak intensity of the Nb (110). Consequently, the maximum intensity was NbO$_2$ (400), and the comparative result was 1% or less as represented by Nb (110)÷NbO$_2$ (400)=0.44%.

Figure 1:
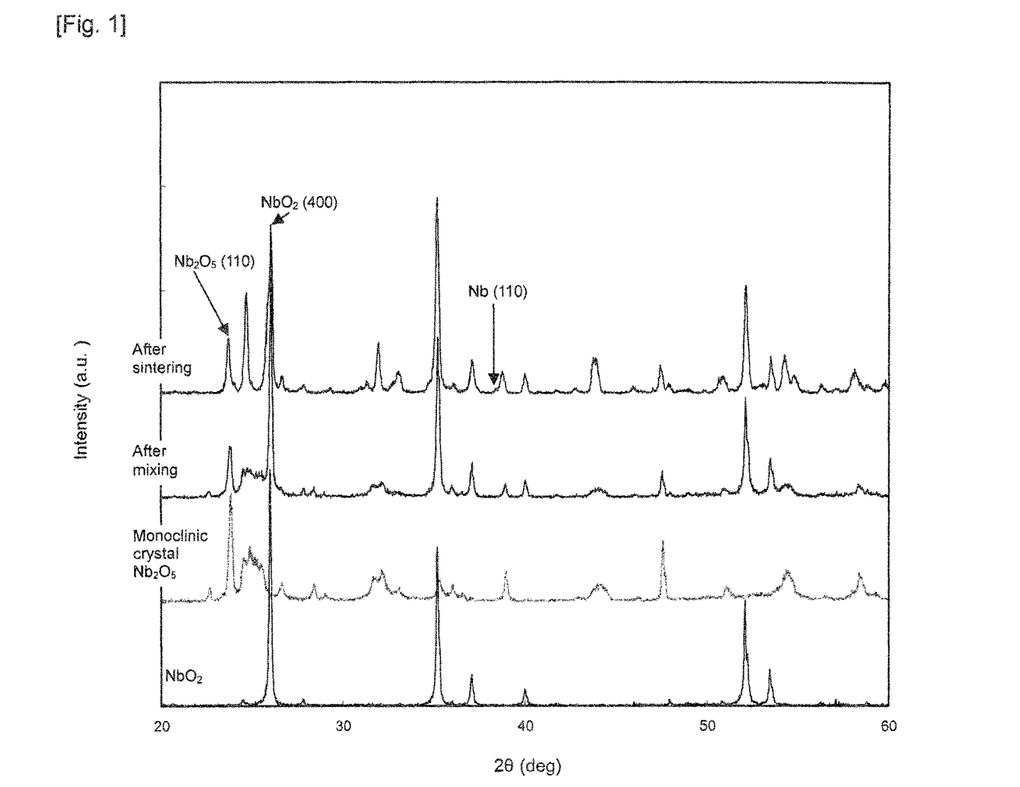
FIG. 1 This is a diagram showing the XRD profile of the sintered compact of Example 1.
Figure 2:
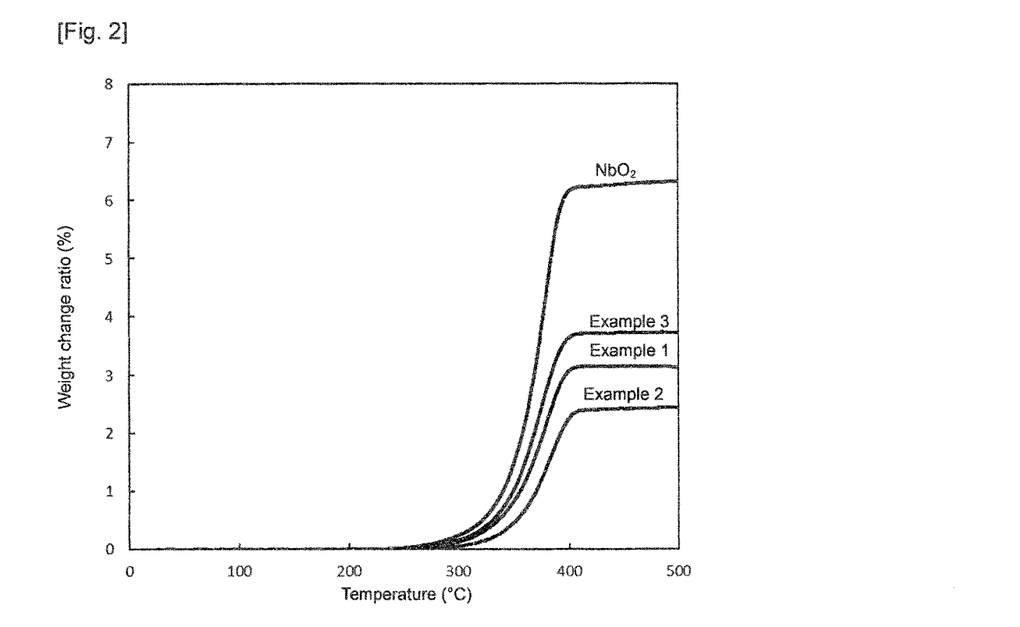
FIG. 2 This is a diagram showing the TG-DTA evaluation of the sintered compacts of Examples 1, 2, and 3.

FIG. 2 shows the weight change of each of the sintered compacts obtained in Examples 1, 2, and 3 as measured with the TG-DTA device manufactured by Rigaku. Note that this is because NbO$_x$ (2<x<2.5) is heated in the atmosphere to become a stable Nb$_2$O$_5$, and the weight will increase due to oxygen adsorption. As shown in FIG. 2, the weight gradually increases from 300° C., and becomes saturated at around a temperature exceeding 400° C. The weight change at the time of saturation is represented as ΔM %. As described above, since the weight change corresponds to the change of oxygen, it is represented with the following formula.

(molecular weight of NbO$_{2.5}$)÷(molecular weight of NbO$_x$)=1+ΔM/100=(Nb+O×2.5)/(Nb+O×$x$)

When this is solved to obtain x, $x$=(O×2.5−ΔM×Nb/100)/(1+ΔM/100)/O (atomic weight of O: 15.9994 g/mol, atomic weight of Nb: 92.9 g/mol)

Figure 3:
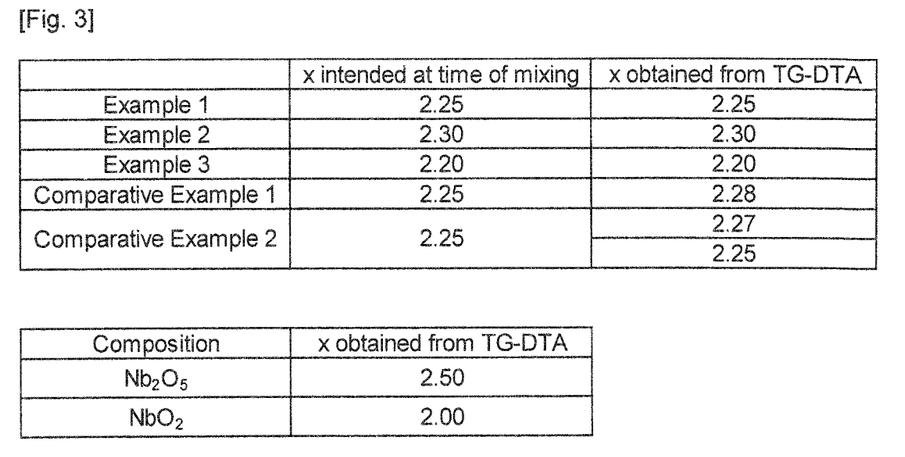
FIG. 3 This is a table showing the relation of target x (composition) and x obtained from the results of TG-DTA.

In the case of Example 1, ΔM=3.15%, and when applied to the foregoing formula, x=2.25 is obtained. Similarly, in Example 2 and Example 3, ΔM=2.408% and ΔM=3.708%, respectively, and when applied to the foregoing formula, x=2.30 and x=2.20, respectively. Sintered compacts having the intended composition (calculated valence of oxygen) were obtained in Examples 1 to 3. The foregoing results are shown in FIG. 3. Note that, when elemental NbO$_2$ and Nb$_2$O$_5$ were measured with TG-DTA, it was confirmed that composition NbO$_2$ is x=2.00, and that composition Nb$_2$O$_5$ is x=2.50.

As in Example 3, even when adding a NbO$_2$ powder to once-mixed power having an arbitrary composition, and then re-mixing the powders, it was confirmed that the intended composition can be obtained. Needless to say, when re-mixing the powders, a Nb$_2$O$_5$ powder may be used for the adjustment rather than a NbO$_2$ powder depending on the value of the intended composition (x).

Comparative Example 1

A Nb powder having an average grain size of 45 μm and a purity of 99.9% and a Nb$_2$O$_5$ powder having an average grain size of 20 μm and a purity of 99.9% were prepared. The Nb powder and the Nb$_2$O$_5$ powder were weighed to attain NbO$_{2.25}$ (Nb powder and Nb$_2$O$_5$ powder in a ratio of 2 mol to 9 mol, which corresponds to 7.207 wt % to 92.793 wt %), and then mixed. Mixing was performed via dry blending.

Figure 4:
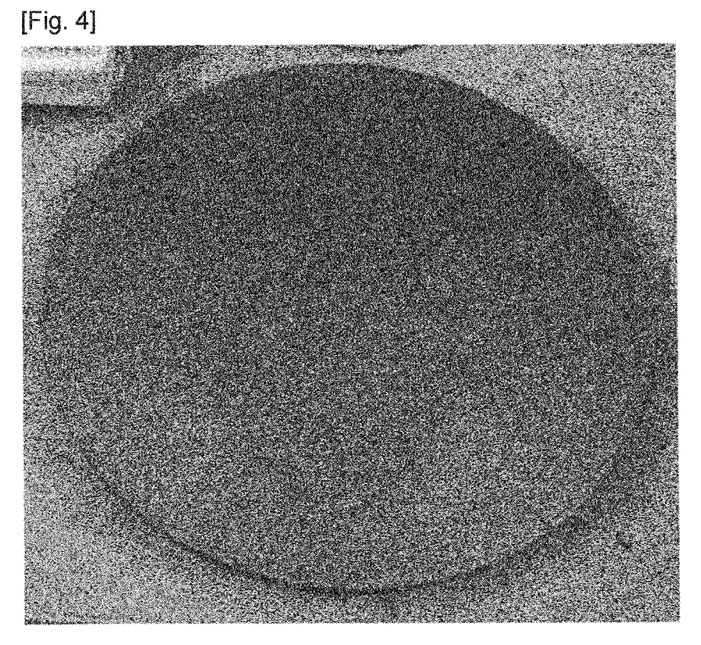
FIG. 4 This is a diagram showing the optical micrograph of the sintered compact (diameter of 460 mm) of Example 2.
Figure 5:
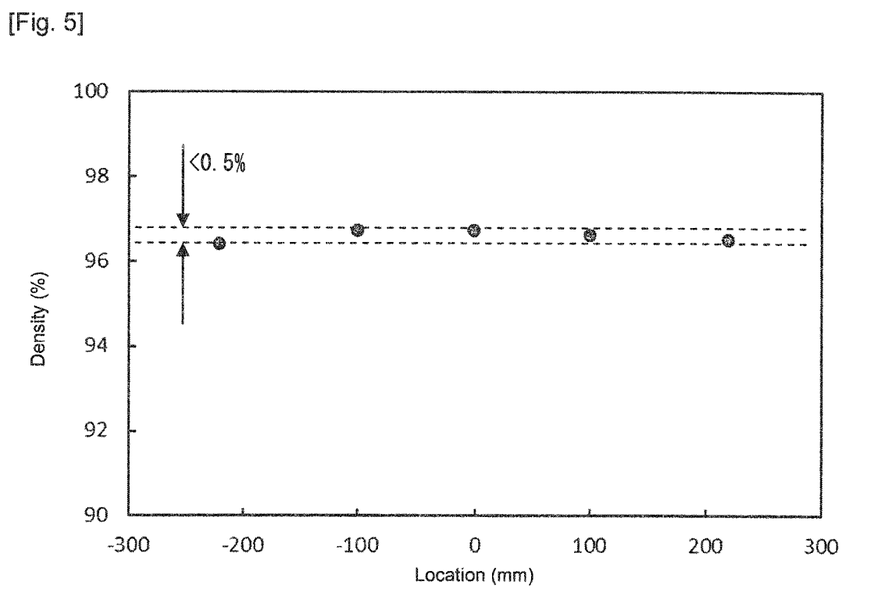
FIG. 5 This is a diagram showing the density distribution of the sintered compact (diameter of 460 mm) of Example 2.
Figure 6:
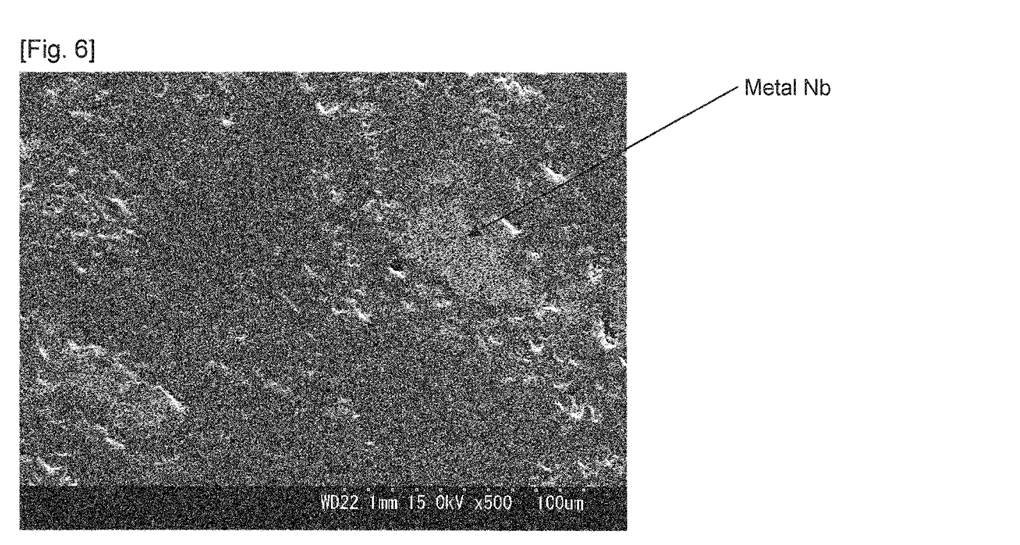
FIG. 6 This is a diagram showing the SEM image of the sintered compact (diameter of 58 mm) of Comparative Example 1.
Figure 7:
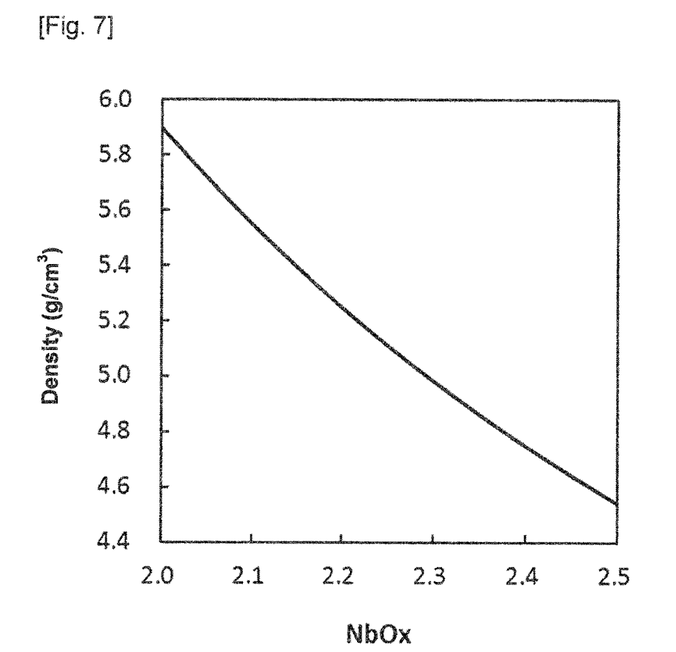
FIG. 7 This is a diagram showing the relation of x (composition) and the theoretical density.
Figure 8:
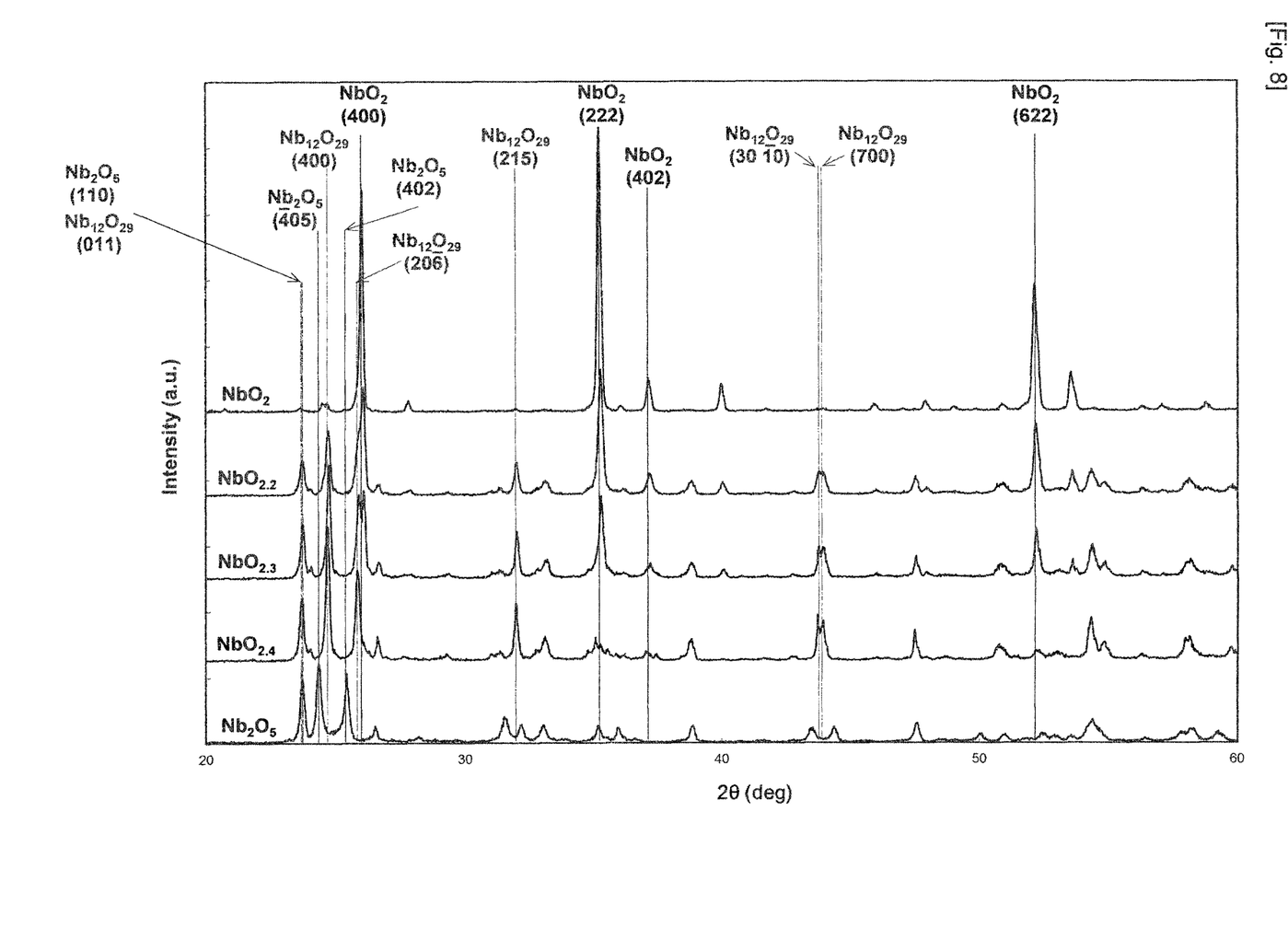
FIG. 8 This is a diagram showing the XRD profile of the sintered compacts of Examples 4 to 6 and Comparative Examples 3 and 4.
Figure 9:
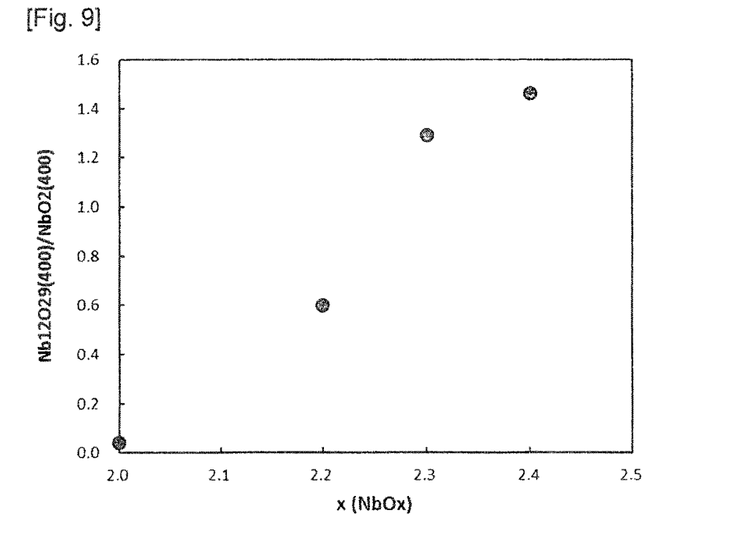
FIG. 9 This is a diagram showing the relationship between: the ratio of the X-ray diffraction peak intensity from the $Nb_{12}O_{29}$ (400) plane relative to the X-ray diffraction peak intensity from the $NbO_2$ (400) plane of the sintered compacts of Examples 4 to 6 and Comparative Example 3; and composition x.
Figure 10:
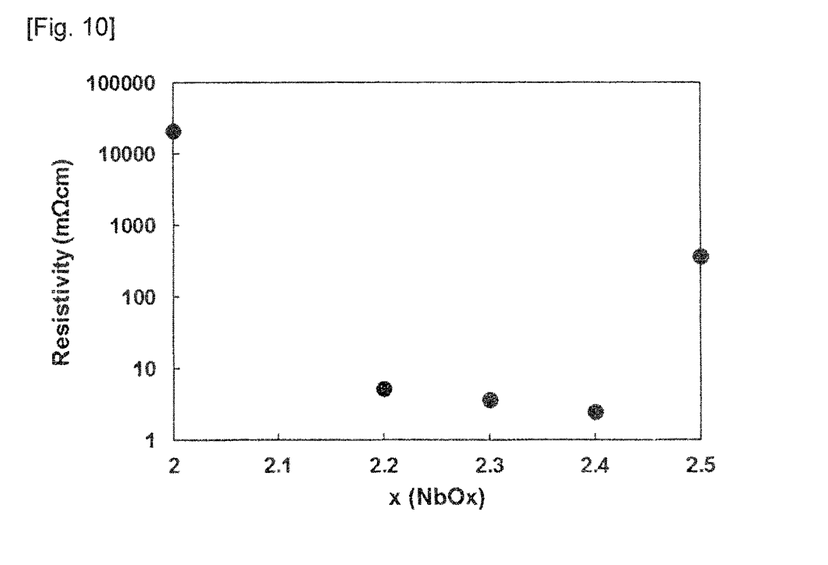
FIG. 10 This is a diagram showing the relationship between: the resistivity of the sintered compacts of Examples 4 to 6 and Comparative Examples 3 and 4; and composition x.
Figure 11:
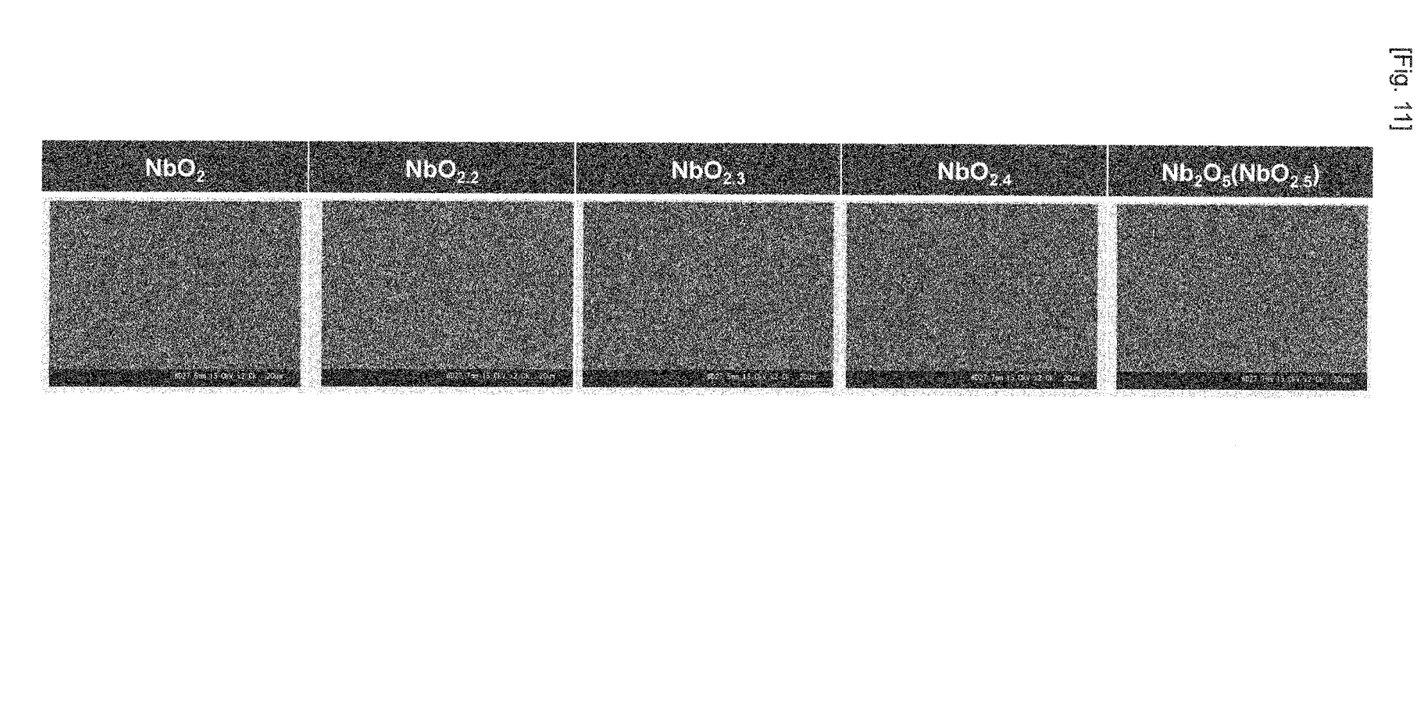
FIG. 11 This is a diagram showing the relationship between: composition x of the sintered compacts of Examples 4 to 6 and Comparative Examples 3 and 4; and the structure (electron micrograph) thereof.

Subsequently, the obtained mixed powder was subject to hot press sintering. The hot press sintering was performed with the intended shape being a diameter of 58 mm and a thickness of 10 mm, and at a hot press temperature of 1100° C. The micrograph of the surface of the obtained sintered compact is shown in FIG. 4. Consequently, it was confirmed that unreacted niobium metal remained. Moreover, voids were formed around the unreacted niobium metal. These voids are undesirable for a target since they may become the cause of particles. The valence of oxygen was measured with TG-DTA, and the result was x=2.28 and greater than anticipated.

Comparative Example 2

A Nb powder having an average grain size of 45 μm and a purity of 99.9% and a $Nb_2O_5$ powder having an average grain size of 20 μm and a purity of 99.9% were prepared. The Nb powder and the $Nb_2O_5$ powder were weighed to attain $NbO_{2.25}$ (Nb powder and $Nb_2O_5$ powder in a ratio of 2 mol to 9 mol, which corresponds to 7.207 wt % to 92.793 wt %), and then mixed. Mixing was performed via dry blending.

Subsequently, the obtained mixed powder was placed in a carbon crucible and subject to heat treatment in an inert gas atmosphere. The heat treatment temperature was 1300° C. and the treatment time was 2 hours. As a result of the measuring the composition of the heat-treated powder with TG-DTA, the composition was x=2.27 and greater than anticipated. Since the intended composition is x=2.25, a Nb powder was added and mixing was performed via dry blending. The mixed powder was once again placed in a carbon crucible and subject to heat treatment in an inert gas atmosphere. The composition after performing the heat treatment once again was x=2.25 as intended, but it was necessary to perform additional heat treatment for adjusting the composition.

Example 4

A $NbO_2$ powder having an average grain size of 1.4 μm and a purity of 99.9%, and a $Nb_2O_5$ powder having an average grain size of 20 μm and a purity of 99.9% were prepared. Because the grain size of the $Nb_2O_5$ powder was coarse at 20 μm, the $Nb_2O_5$ powder was pulverized with an SC mill until the grain size became comparable with the grain size of the $NbO_2$ powder ($D_{50}$=roughly 1.4 μm).

Subsequently, the $Nb_2O_5$ powder and the $NbO_2$ powder were weighed to attain $NbO_{2.2}$ ($Nb_2O_5$ powder and $NbO_2$ powder in a weight ratio of 41.50% to 58.50%), and then mixed. Mixing was performed via wet blending, and the raw material powders were placed in ethanol to obtain a slurry, and the slurry was mixed and thereafter dried and crushed to obtain a mixed powder.

Subsequently, the obtained $NbO_{2.2}$ powder was subject to hot press sintering. The hot press sintering was performed with the intended shape being a diameter of 58 mm and a thickness of 10 mm, and at a hot press temperature of 1050° C. Consequently, the obtained sintered compact has an average relative density of 98.4%, and was high density. Moreover, it was possible to suppress the difference in the in-plane density distribution of the sintered compact to 0.5% or less. Note that the relative density was calculated with the true density (theoretical density) as 5.249 g/cm³. Moreover, the resistivity of the obtained sintered compact was measured using a resistivity meter (model K-705RS) manufactured by Kyowa Riken Co., Ltd., and the result was 5.3 mΩ·cm.

Next, the sintered compact was evaluated using the X-ray diffraction device manufactured by Rigaku. Since the peak intensity of $NbO_2$ and the peak intensity of $Nb_2O_5$ increase/decrease depending on the composition, a comparison was made between the maximum peak intensity among the foregoing peak intensities or the maximum peak intensity at the time of scanning up to 2θ=20 to 60°, and the peak intensity of the Nb (110). Consequently, the maximum intensity was $NbO_2$ (222), and the comparative result was 1% or less as represented by Nb (110)÷$NbO_2$ (222)=0.21%. Moreover, it was possible to confirm the X-ray diffraction peak of $Nb_{12}O_{29}$, and the intensity ratio of the X-ray diffraction peak intensity from the $Nb_{12}O_{29}$ (400) plane relative to the X-ray diffraction peak intensity from the $NbO_2$ (400) plane was 0.6 times. The obtained sintered compact was polished and the structure was observed with an electron microscope (model S-3000N) manufactured by Hitachi High-Technologies Corporation, and a light gray island-shaped pattern was observed on a dark gray surface.

Example 5

A $NbO_2$ powder having an average grain size of 1.4 μm and a purity of 99.9%, and a $Nb_2O_5$ powder having an average grain size of 20 μm and a purity of 99.9% were prepared. Because the grain size of the $Nb_2O_5$ powder was coarse at 20 μm, the $Nb_2O_5$ powder was pulverized with an SC mill until the grain size became comparable with the grain size of the $NbO_2$ powder ($D_{50}$=roughly 1.4 μm).

Subsequently, the $Nb_2O_5$ powder and the $NbO_2$ powder were weighed to attain $NbO_{2.3}$ ($Nb_2O_5$ powder and $NbO_2$ powder in a weight ratio of 61.48% to 38.52%), and then mixed. Mixing was performed via wet blending, and the raw material powders were placed in ethanol to obtain a slurry, and the slurry was mixed and thereafter dried and crushed to obtain a mixed powder.

Subsequently, the obtained $NbO_{2.3}$ powder was subject to hot press sintering. The hot press sintering was performed with the intended shape being a diameter of 58 mm and a thickness of 10 mm, and at a hot press temperature of 1050° C. Consequently, the obtained sintered compact has an average relative density of 97.3%, and was high density. Moreover, it was possible to suppress the difference in the in-plane density distribution of the sintered compact to 0.5% or less. Note that the relative density was calculated with the true density (theoretical density) as 4.984 g/cm³. Moreover, the resistivity of the obtained sintered compact was measured using a resistivity meter (model K-705RS) manufactured by Kyowa Riken Co., Ltd., and the result was 3.7 mΩ·cm.

Next, the sintered compact was evaluated using the X-ray diffraction device manufactured by Rigaku. Since the peak intensity of $NbO_2$ and the peak intensity of $Nb_2O_5$ increase/decrease depending on the composition, a comparison was made between the maximum peak intensity among the foregoing peak intensities or the maximum peak intensity at the time of scanning up to 2θ=20 to 60°, and the peak intensity of the Nb (110). Consequently, the maximum intensity was $NbO_2$ (400), and the comparative result was 1% or less as represented by Nb (110)÷$NbO_2$ (400)=0.14%. Moreover, it was possible to confirm the X-ray diffraction peak of $Nb_{12}O_{29}$, and the intensity ratio of the X-ray diffraction peak intensity from the $Nb_{12}O_{29}$ (400) plane relative to the X-ray diffraction peak intensity from the $NbO_2$ (400) plane was 1.29 times. The obtained sintered compact was polished and the structure was observed with an electron microscope (model S-3000N) manufactured by Hitachi High-Technologies Corporation, and a light gray island-shaped pattern was observed on a dark gray surface. The area of this light-gray island shaped pattern decreased in comparison to Example 4.

Example 6

A $NbO_2$ powder having an average grain size of 1.4 μm and a purity of 99.9%, and a $Nb_2O_5$ powder having an average grain size of 20 μm and a purity of 99.9% were prepared. Because the grain size of the $Nb_2O_5$ powder was coarse at 20 μm, the $Nb_2O_5$ powder was pulverized with an SC mill until the grain size became comparable with the grain size of the $NbO_2$ powder ($D_{50}$=roughly 1.4 μm). Subsequently, the $Nb_2O_5$ powder and the $NbO_2$ powder were weighed to attain $NbO_{2.4}$ ($Nb_2O_5$ powder and $NbO_2$ powder in a weight ratio of 80.98% to 19.02%), and then mixed. Mixing was performed via wet blending, and the raw material powders were placed in ethanol to obtain a slurry, and the slurry was mixed and thereafter dried and crushed to obtain a mixed powder.

Subsequently, the obtained $NbO_{2.4}$ powder was subject to hot press sintering. The hot press sintering was performed with the intended shape being a diameter of 58 mm and a thickness of 10 mm, and at a hot press temperature of 1050° C. Consequently, the obtained sintered compact has an average relative density of 97.4%, and was high density. Moreover, it was possible to suppress the difference in the in-plane density distribution of the sintered compact to 0.5% or less. Note that the relative density was calculated with the true density (theoretical density) as 4.750 g/cm³. Moreover, the resistivity of the obtained sintered compact was measured using a resistivity meter (model K-705RS) manufactured by Kyowa Riken Co., Ltd., and the result was 2.5 mΩ·cm.

Next, the sintered compact was evaluated using the X-ray diffraction device manufactured by Rigaku. Since the peak intensity of $NbO_2$ and the peak intensity of $Nb_2O_5$ increase/decrease depending on the composition, a comparison was made between the maximum peak intensity among the foregoing peak intensities or the maximum peak intensity at the time of scanning up to 2θ=20 to 60°, and the peak intensity of the Nb (110). Consequently, the maximum intensity was $NbO_2$ (400), and the comparative result was 1% or less as represented by Nb (110)÷$NbO_2$ (400)=0.65%. Moreover, it was possible to confirm the X-ray diffraction peak of $Nb_{12}O_{29}$, and the intensity ratio of the X-ray diffraction peak intensity from the $Nb_{12}O_{29}$ (400) plane relative to the X-ray diffraction peak intensity from the $NbO_2$ (400) plane was 1.46 times. The obtained sintered compact was polished and the structure was observed with an electron microscope (model S-3000N) manufactured by Hitachi High-Technologies Corporation, and a light gray island-shaped pattern was observed on a dark gray surface. The area of this light-gray island shaped pattern decreased in comparison to Examples 4 and 5. Based on the X-ray diffraction results, the X-ray diffraction peak of $NbO_2$ decreases as the composition x increases. Since there is correlation between the island-shaped area and the X-ray diffraction peak intensity of $NbO_2$, the island-shaped pattern is considered to be $NbO_2$.

Comparative Example 3

A $NbO_2$ powder having an average grain size of 1.4 μm and a purity of 99.9% was prepared. Subsequently, the $NbO_{2.0}$ powder was subject to hot press sintering. The hot press sintering was performed with the intended shape being a diameter of 58 mm and a thickness of 10 mm, and at a hot press temperature of 1050° C. Consequently, the obtained sintered compact has an average relative density of 98.5%, and was high density. Moreover, it was possible to suppress the difference in the in-plane density distribution of the sintered compact to 0.5% or less. Note that the relative density was calculated with the true density (theoretical density) as 5.9 g/cm³. Moreover, the resistivity of the obtained sintered compact was measured using a resistivity meter (model K-705RS) manufactured by Kyowa Riken Co., Ltd., and the result was 21.6 Ω·cm.

Next, the sintered compact was evaluated using the X-ray diffraction device manufactured by Rigaku. Since the peak intensity of $NbO_2$ and the peak intensity of $Nb_2O_5$ increase/decrease depending on the composition, a comparison was made between the maximum peak intensity among the foregoing peak intensities or the maximum peak intensity at the time of scanning up to 2θ=20 to 60°, and the peak intensity of the Nb (110). Consequently, the maximum intensity was $NbO_2$ (222), and the comparative result was 1% or less as represented by Nb (110)÷$NbO_2$ (2220)=0.16%. Moreover, it was possible to confirm the X-ray diffraction peak of $Nb_{12}O_{29}$, and the intensity ratio of the X-ray diffraction peak intensity from the $Nb_{12}O_{29}$ (400) plane relative to the X-ray diffraction peak intensity from the $NbO_2$ (400) plane was 0.04 times.

Comparative Example 4

A $Nb_2O_5$ powder having an average grain size of 20 μm and a purity of 99.9% was prepared. Because the grain size of the $Nb_2O_5$ powder was coarse at 20 μm, the $Nb_2O_5$ powder was pulverized with an SC mill until the grain size became around $D_{50}$=roughly 1.4 μm.

Subsequently, the $NbO_{2.5}$ powder was subject to hot press sintering. The hot press sintering was performed with the intended shape being a diameter of 58 mm and a thickness of 10 mm, and at a hot press temperature of 1050° C. Consequently, the obtained sintered compact has an average relative density of 97.1%, and was high density. Moreover, it was possible to suppress the difference in the in-plane density distribution of the sintered compact to 0.5% or less. Note that the relative density was calculated with the true density (theoretical density) as 4.542 g/cm³. Moreover, the resistivity of the obtained sintered compact was measured using a resistivity meter (model K-705RS) manufactured by Kyowa Riken Co., Ltd., and the result was 375 Ω·cm. With regard to $NbO_{2.5}$, since $NbO_2$ and $Nb_{12}O_{29}$ do not exist, ratio calculation was not performed.

The sintered compact of the present invention having a composition of $NbO_x$ (2<x<2.5) may be used as a sputtering target, and the thin film formed by using the foregoing sputtering target is useful as a high-quality resistance change layer for use in ReRAM. In addition, as a major feature of the present invention, it is possible to produce a sintered compact from a suboxide which does not exist as a raw material powder, and, because a high-density sintered compact can be obtained, stable sputtering can be realized, and the present invention is extremely effective for efficient production demanded in recent years.

The invention claimed is:
1. A niobium oxide sintered sputtering target having a composition of $NbO_x$ (2<x<2.5) and a relative density of 90% or higher, wherein a ratio of an X-ray diffraction peak intensity from (110) plane of Nb to an X-ray diffraction peak intensity which is highest among intensities of X-ray dif- fraction peaks from (400) plane of $NbO_2$, (001) plane of $Nb_2O_5$, and (110) plane of $Nb_2O_5$ and of X-ray diffraction peaks observable within a range of 2θ from 20° to 60° is 1% or less, and wherein a ratio of an X-ray diffraction peak intensity from a $Nb_{12}O_{29}$ (400) plane relative to an X-ray diffraction peak intensity from a $NbO_2$ (400) plane is 10% or higher.

2. The niobium oxide sintered sputtering target according to claim 1, wherein a difference in relative densities measured at arbitrary in-plane points of the niobium oxide sintered sputtering target is 1.0% or less.

3. The niobium oxide sintered sputtering target according to claim 2, wherein the niobium oxide sintered sputtering target has a diameter of 58 mm or more.

4. The niobium oxide sintered sputtering target according to claim 3, wherein the niobium oxide sintered sputtering target has a resistivity of 10 Ω·cm or less.

5. A method of producing the niobium oxide sintered sputtering target according to claim 1, wherein a $NbO_2$ powder and a $Nb_2O_5$ powder are mixed, and the pulverized powder thereof is sintered via hot press at 950° C. to 1300° C.

6. The method of producing a niobium oxide sintered sputtering target according to claim 5, wherein an average grain size of the $NbO_2$ powder is 1 to 10 μm, and an average grain size of the $Nb_2O_5$ powder is 1 to 10 μm.

7. The method of producing a niobium oxide sintered sputtering target according to claim 6, wherein the $NbO_2$ powder and the $Nb_2O_5$ powder are mixed via wet blending.

8. The method of producing a niobium oxide sintered sputtering target according to claim 7, wherein the $NbO_2$ powder has a purity of 99.9% or higher, and the $Nb_2O_5$ powder has a purity of 99.9% or higher.

9. The niobium oxide sintered sputtering target according to claim 1, wherein the niobium oxide sintered sputtering target has a diameter of 58 mm or more.

10. The niobium oxide sintered sputtering target according to claim 1, wherein the niobium oxide sintered sputtering target has a resistivity of 10 Ω·cm or less.

11. The method of producing a niobium oxide sintered sputtering target according to claim 5, wherein the $NbO_2$ powder and the $Nb_2O_5$ powder are mixed via wet blending.

12. The method of producing a niobium oxide sintered sputtering target according to claim 5, wherein the $NbO_2$ powder has a purity of 99.9% or higher, and the $Nb_2O_5$ powder has a purity of 99.9% or higher.

13. The niobium oxide sintered sputtering target according to claim 1, wherein the composition is $NbO_x$ (2.20≤x≤2.4).

14. The niobium oxide sintered sputtering target according to claim 1, wherein the composition is $NbO_x$ (2.20≤x≤2.30).

* * * * *